(12) United States Patent
Nakano (10) Patent No.: US 10,797,018 B2
(45) Date of Patent: Oct. 6, 2020

(54) METHODS FOR FABRICATING 3D SEMICONDUCTOR DEVICE PACKAGES, RESULTING PACKAGES AND SYSTEMS INCORPORATING SUCH PACKAGES

(71) Applicant: Micron Technology, Inc., Boise, ID (US)

(72) Inventor: Eiichi Nakano, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/392,221

(22) Filed: Apr. 23, 2019

(65) Prior Publication Data

US 2019/0348394 A1 Nov. 14, 2019

Related U.S. Application Data

(62) Division of application No. 15/976,398, filed on May 10, 2018, now Pat. No. 10,319,696.

(51) Int. Cl.
| | |
|---|---|
| H01L 23/02 | (2006.01) |
| H01L 23/00 | (2006.01) |
| H01L 25/065 | (2006.01) |
| H01L 25/18 | (2006.01) |
| H01L 25/00 | (2006.01) |
| H01L 21/78 | (2006.01) |
| H01L 21/683 | (2006.01) |

(52) U.S. Cl.
CPC .......... *H01L 24/94* (2013.01); *H01L 21/6835* (2013.01); *H01L 21/78* (2013.01); *H01L 24/11* (2013.01); *H01L 25/0657* (2013.01); *H01L 25/18* (2013.01); *H01L 25/50* (2013.01); *H01L 2221/6834* (2013.01); *H01L 2221/68327* (2013.01); *H01L 2221/68372* (2013.01); *H01L 2221/68381* (2013.01); *H01L 2224/11* (2013.01); *H01L 2224/13082* (2013.01); *H01L 2224/13147* (2013.01); *H01L 2225/06541* (2013.01); *H01L 2924/1434* (2013.01); *H01L 2924/1436* (2013.01)

(58) Field of Classification Search
CPC ..... H01L 24/94; H01L 21/78; H01L 25/0657; H01L 2225/06541; H01L 2225/06555
USPC ................................................. 257/686, 777
See application file for complete search history.

(56) References Cited

U.S. PATENT DOCUMENTS

| 6,444,560 B1 | 9/2002 | Pogge et al. | |
| 6,652,799 B2 * | 11/2003 | Seng | B29C 45/02 264/272.15 |

(Continued)

OTHER PUBLICATIONS

Guogang et al., Preparation Methods and Application of Silicon Oxide Films, International Conference on Mechatronics, Electronic, Industrial and Control Engineering (2014), 6 pages.

(Continued)

*Primary Examiner* — Nitin Parekh
(74) *Attorney, Agent, or Firm* — TraskBritt (57) ABSTRACT

Methods of forming semiconductor device packages comprising stacking multiple dice, the die stack exhibiting thin bond lines and having an outer environmental coating, the bond lines and environmental coating comprising an in situ formed compound. Semiconductor device packages so formed and electronic systems incorporating such packages are also disclosed.

17 Claims, 9 Drawing Sheets

(56) References Cited

U.S. PATENT DOCUMENTS

| | | | |
|---|---|---|---|
| 7,151,009 B2 * | 12/2006 | Kim | H01L 21/563 438/106 |
| 7,595,017 B2 * | 9/2009 | Siegel | H01L 21/566 264/272.14 |
| 7,919,873 B2 | 4/2011 | Lee et al. | |
| 8,124,456 B2 * | 2/2012 | Kinsley | H01L 24/72 257/686 |
| 8,399,974 B1 | 3/2013 | Huneke | |
| 8,426,246 B2 * | 4/2013 | Toh | H01L 25/0657 438/108 |
| 9,391,143 B2 | 7/2016 | Tong et al. | |
| 2002/0139577 A1 * | 10/2002 | Miller | H01L 21/76898 174/261 |
| 2005/0282374 A1 | 12/2005 | Hwang et al. | |
| 2006/0040510 A1 | 2/2006 | Lee et al. | |
| 2008/0293186 A1 * | 11/2008 | Hao | H01L 24/14 438/109 |
| 2010/0203676 A1 | 8/2010 | Theuss et al. | |
| 2011/0156232 A1 * | 6/2011 | Youn | H01L 23/481 257/686 |
| 2011/0309492 A1 | 12/2011 | Chi et al. | |
| 2012/0217645 A1 | 8/2012 | Pagaila | |
| 2012/0241941 A1 | 9/2012 | Kim et al. | |
| 2013/0037802 A1 * | 2/2013 | England | H01L 25/18 257/48 |
| 2013/0221493 A1 * | 8/2013 | Kim | H01L 23/481 257/620 |
| 2014/0273350 A1 | 9/2014 | Kwak et al. | |
| 2014/0357020 A1 | 12/2014 | Aleksov et al. | |
| 2015/0091178 A1 | 4/2015 | Reber et al. | |
| 2015/0115463 A1 | 4/2015 | Pelley et al. | |
| 2015/0162265 A1 * | 6/2015 | Jo | H01L 25/0657 257/774 |
| 2015/0235989 A1 | 8/2015 | Yu et al. | |
| 2015/0252217 A1 | 9/2015 | Czubarow et al. | |
| 2015/0380386 A1 | 12/2015 | Vincent et al. | |
| 2017/0077022 A1 | 3/2017 | Scanlan et al. | |
| 2017/0084596 A1 | 3/2017 | Scanlan | |
| 2017/0148674 A1 | 5/2017 | Lu et al. | |
| 2018/0006006 A1 | 1/2018 | Kim et al. | |
| 2018/0151507 A1 | 5/2018 | Chen et al. | |
| 2018/0158749 A1 * | 6/2018 | Yu | H01L 23/3675 |

OTHER PUBLICATIONS

Sanchez et al., Chip to Wafer Direct Bonding Technologies for High Density 3D Integration, 2012 IEEE 62nd Electronic Components and Technology Conference , (May 29-Jun. 1, 2012), 6 pages.

* cited by examiner

METHODS FOR FABRICATING 3D SEMICONDUCTOR DEVICE PACKAGES, RESULTING PACKAGES AND SYSTEMS INCORPORATING SUCH PACKAGES

CROSS-REFERENCE TO RELATED APPLICATION

This application is a divisional of U.S. patent application Ser. No. 15/976,398, filed May 10, 2018, pending, the disclosure of which is hereby incorporated herein in its entirety by this reference.

TECHNICAL FIELD

Embodiments disclosed herein relate to methods of fabricating packages comprising multiple semiconductor dice. More particularly, embodiments disclosed herein relate to methods for fabricating three-dimensional packages comprising multiple, stacked semiconductor dice, resulting packages and systems incorporating such packages.

BACKGROUND

As the electronics industry has evolved and encompassed more and different applications, for example, smart phones and other mobile devices, increasingly compact personal (laptop and tablet) computers, artificial intelligence, the Internet of Things and cloud computing, there is an ever-increasing demand for high density, small form factor modular packages comprising stacked semiconductor dice. In such an instance, form factor includes not only the footprint (length and width) of a package but also the height, a significant consideration in mobile applications among others. Such demand is not only directed toward memory die packages, but also toward packages comprising not only memory dice but also memory dice in combination with one or more of logic, processor and radiofrequency (RF) dice.

While it has been demonstrated to be possible to fabricate such packages, the ability to do so to provide a small form factor at a reasonable cost and acceptable yield on a commercial scale has to date, eluded the semiconductor industry.

DETAILED DESCRIPTION

Methods of fabricating semiconductor device packages comprising multiple, stacked semiconductor dice are disclosed. In some embodiments, the packages comprise only memory dice, while in other embodiments the packages comprise memory dice and at least one other type of die, for example, a processor, logic or radiofrequency (RF) die.

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Embodiments of the disclosure may be practiced in conjunction with conventional fabrication techniques employed in the industry. In addition, the description provided below does not form a complete process flow for manufacturing a semiconductor device package, a semiconductor device package, or a higher-level assembly including a semiconductor device package. Only those process acts and structures necessary to understand the embodiments of the disclosure are described in detail below. Additional acts to form a complete semiconductor device package, or higher-level assembly including a semiconductor device package from process and package described herein may be performed by conventional fabrication processes.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

As used herein the terms "layer" and "film" mean and include a level, sheet or coating of material residing on a structure, which level, sheet or coating may be continuous or discontinuous between portions of the material, and which may be conformal or non-conformal, unless otherwise indicated.

As used herein the term "wafer" means and includes not only a conventional, substantially circular wafer of a single material, such as single crystal silicon, but also other bulk substrates in the form of a silicon-on-insulator (SOI) structure, as well as bulk substrates comprising other semiconductor materials, for example, germanium, or gallium arsenide.

As used herein, the term "compound" means and includes a material consisting of two or more different types of atoms in a fixed, stoichiometric or non-stoichiometric proportion and having a unique chemical structure held together in defined spatial arrangement by chemical bonds.

Figure 1:
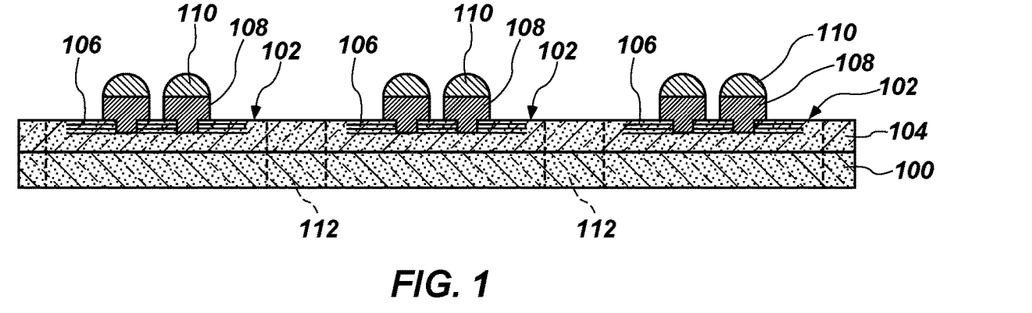
FIGS. 1 through 14 are schematic cross-sectional views of an embodiment of a method of fabricating a semiconductor device package according to an embodiment of the disclosure.

FIG. 1 is a schematic, cross-sectional view of a base semiconductor wafer, for example, a silicon wafer 100, comprising multiple die locations 102. Each die location 102 comprises an active surface, which may also be characterized as a device layer 104, comprising active circuitry 106, for example, memory circuitry in the form of dynamic random access memory (DRAM) circuitry or NAND flash memory circuitry. Active circuitry 106 is in electrical communication with external conductive elements in the form of, for example, copper pillars 108 having (optional) solder caps 110 thereon. FIG. 1 also denotes scribe areas 112 in silicon wafer 100, delineating so-called "streets" between adjacent semiconductor die locations 102.

Figure 2:
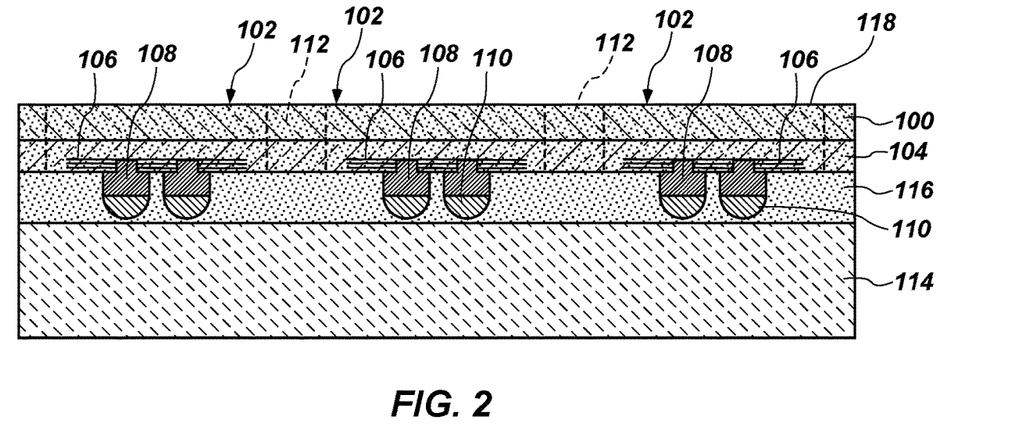

FIG. 2 is a schematic, cross-sectional view of silicon wafer 100 inverted from an orientation shown in FIG. 1 and secured to a carrier substrate 114, which may comprise silicon, a glass, a ceramic, or other suitable material. Wafer 100 is secured to carrier substrate 114 with a temporary adhesive 116, for example, a thermal release adhesive, a solvent release adhesive, or an ultraviolet (UV) release adhesive, with copper pillars 108 and (optional) solder caps 110 embedded in the temporary adhesive 116 and back side 118 of silicon wafer 100 facing away from carrier substrate 114.

Figure 3:
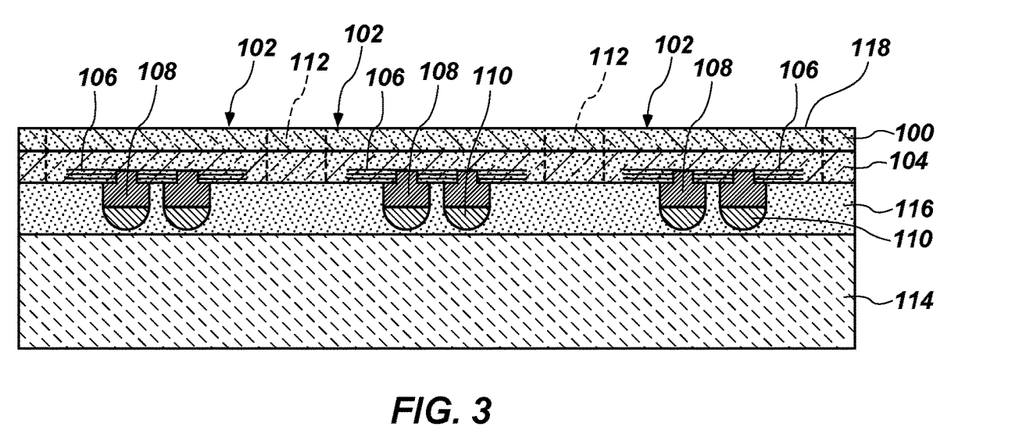

In FIG. 3, silicon wafer 100, while secured to carrier substrate 114, has been thinned from its back side 118, for example, from an initial thickness of about 600 µm to about 700 µm to a final thickness of between about 30 µm to about 70 µm. Thinning may be effected by, for example, coarse back grinding followed by fine grinding or polishing, wet (chemical) etching, or dry plasma etching, or by chemical mechanical planarization (CMP). Of course, the process or processes employed in thinning are related to whether through vias are preformed in wafer 100 or formed after attachment to a carrier substrate, as described below.

Figure 4:
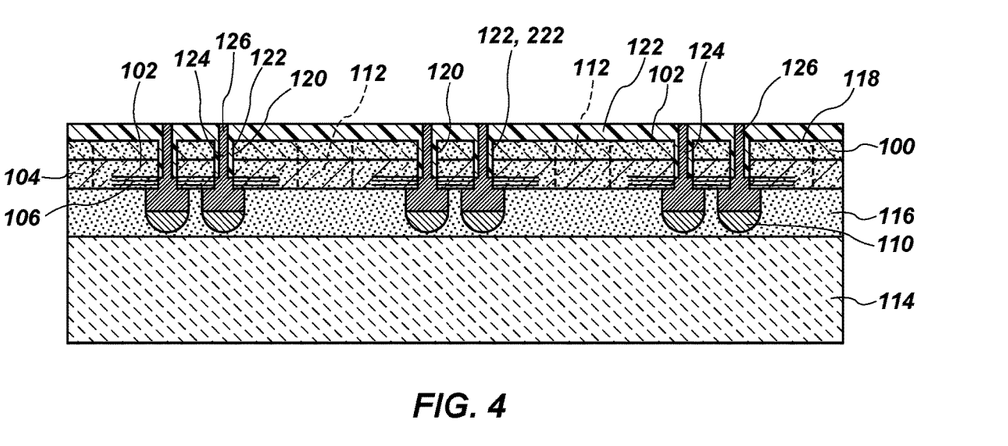

As shown in FIG. 4, after silicon wafer 100 is thinned, in one embodiment a dielectric material 122, which may also be characterized as a dielectric bond line material, is formed on the back side 118, after which through vias 120 are formed, example, by aniosotropic (e.g., reactive ion) etching, through the dielectric material 122 on the back side 118 of wafer 100 and extending though wafer 100 to electrically connect to active circuitry 106. Through vias 120 are lined with a dielectric material 222 and via conductors 124 comprising conductive pillars 126, for example, of a metal such as copper, are formed by a deposition process. In another embodiment, through vias 120 are formed before dielectric material 122 is formed, and a common dielectric material 122 lines through vias 120 and extends over back side 118 of wafer 100. Via conductor 124 and integral conductive pillar 126 are then formed. Dielectric material 122 may be a non-polymeric material, be devoid of filler material and may comprise, for example, a silicon oxide (e.g., $SiO_2$), a silicon nitride (e.g., $Si_3N_4$), a silicon oxynitride (e.g., $SiO_xN_y$), or a TEOS oxide or an $O_3$/TEOS oxide, as disclosed in U.S. Patent Publication No. US 2017/0148674 A1, assigned to the Assignee of the present disclosure. Dielectric material 122 may be formed as a compound in situ by chemical vapor deposition (CVD), atomic layer deposition (ALD), plasma enhanced chemical vapor deposition (PECVD), sub atmospheric chemical vapor deposition (SACVD) physical vapor deposition, atmospheric pressure plasma deposition, or other known technique. Dielectric material 222, if employed, may comprise one of the above-referenced materials and comprise the same, or a different dielectric material than dielectric material 122.

In another embodiment, through vias 120 may be preformed as blind vias lined with a dielectric material 222 and comprising via conductors 124 in wafer 100 prior to thinning thereof as illustrated in FIG. 3. Conductors 124 are then exposed by etching from the back side 118 of wafer 100 to provide conductive pillars 126 protruding from the back side 118, after which another dielectric material 122 may be applied as a layer over back side 118 of wafer 100 to arrive at the structure shown in FIG. 4.

In any of the foregoing embodiments, dielectric material 122 as formed is extremely thin, on the order of about 10 μm to about 25 μm, to provide a very narrow bond line with a subsequently placed semiconductor die, as described below.

Figure 5A:
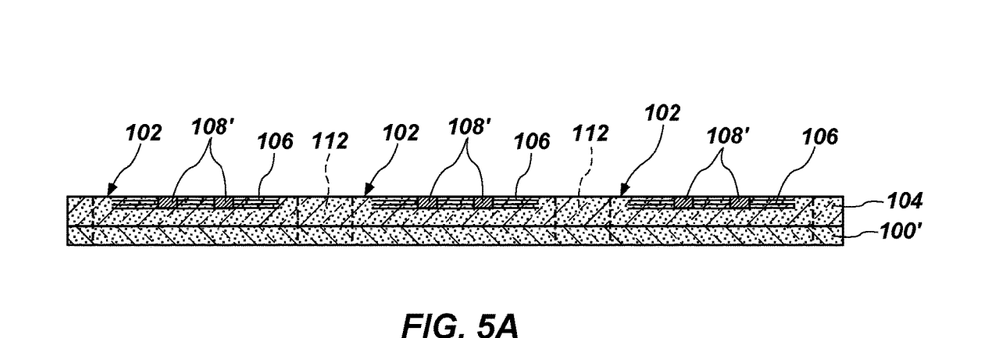
Figure 5B:
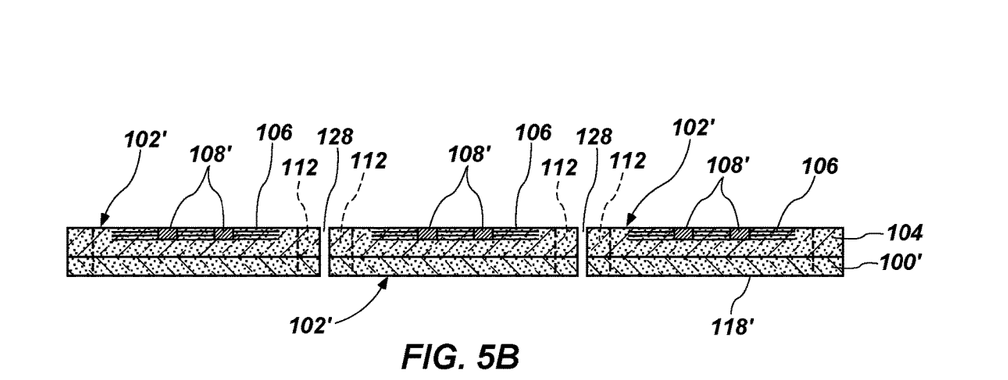

FIGS. 5A and 5B depict another wafer 100' comprising semiconductor die locations 102, each bearing active circuitry 106 on a device layer 104 operably coupled to terminal pads 108', which may comprise copper and which may also be characterized as bond pads. Semiconductor die locations 102 are separated by scribe areas 112. Wafer 100' as shown has, like wafer 100, been thinned from an initial thickness of about 600 μm to about 700 μm to a final thickness of between about 30 μm to about 70 μm. As shown in FIG. 5B, wafer 100' has been separated, or "singulated," at cut 128 through scribe areas 112 into individual semiconductor dice 102'. Notably, as shown in FIG. 5B, the singulation is effected with a very narrow dicing saw blade width, leaving a substantial width of semiconductor material within scribe area 112 intact on each side of cut 128.

Figure 6:
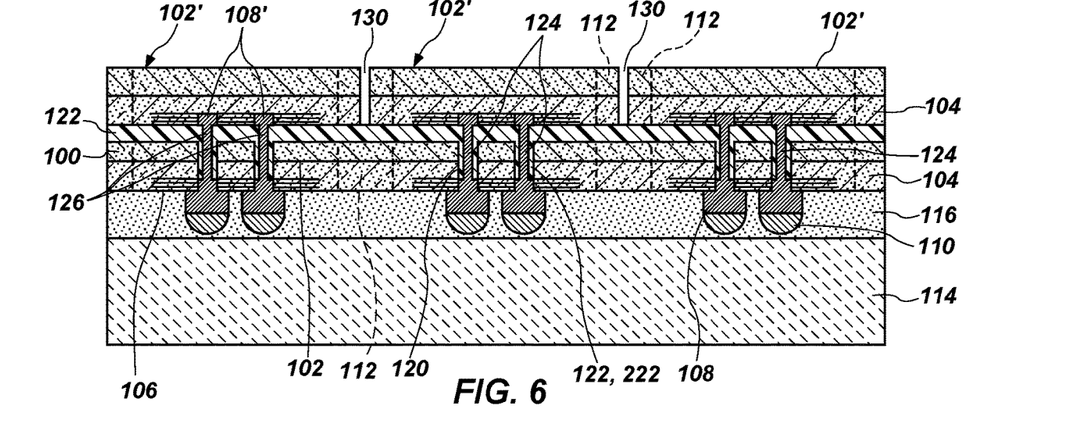

In FIG. 6, a first level of individual semiconductor dice 102' singulated from a wafer 100' and preferably comprising known good die (KGD) have been placed in mutually laterally spaced relationship, using conventional pick-and-place equipment, on wafer 100, each semiconductor die 102' superimposed on a semiconductor die location 102 of wafer 100 with terminal pads 108', aligned with conductive pillars 126 of an underlying semiconductor die location 102. Electrical coupling between conductive pillars 126 and terminal pads 108' may be effected, for example, by diffusion bonding of a copper pillar 126 to a copper terminal pad 108', or by dielectric bonding between each semiconductor die 102' and dielectric material 122 over its corresponding underlying semiconductor die location 102, using dielectric material 122 previously applied to the back side 118 of wafer 100. Dielectric bonding may be effected as known in the art, for example, as disclosed in U.S. Pat. No. 9,391,143. With either technique, a very thin bond line may be achieved while ensuring mutual electrical and mechanical coupling between adjacent semiconductor dice 102' and between a semiconductor die location 102 and the adjacent semiconductor die 102'. Due to thermal budget and process time issues, diffusion bonding or dielectric bonding may be effected after all levels of semiconductor dice 102' are stacked.

Figure 7:
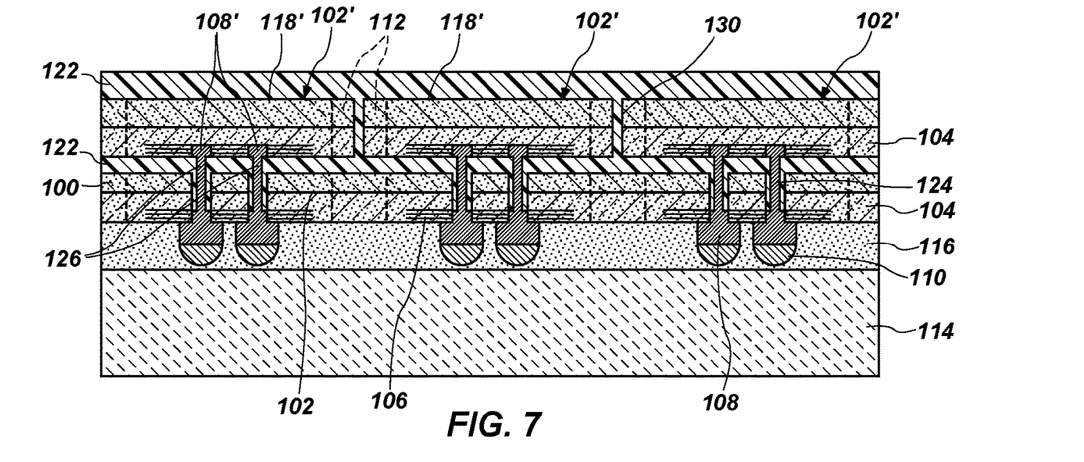

In FIG. 7, another dielectric material 122 is applied over and covers the back sides 118' of semiconductor dice 102' and extends into spaces 130 between adjacent semiconductor dice 102'.

Figure 8:
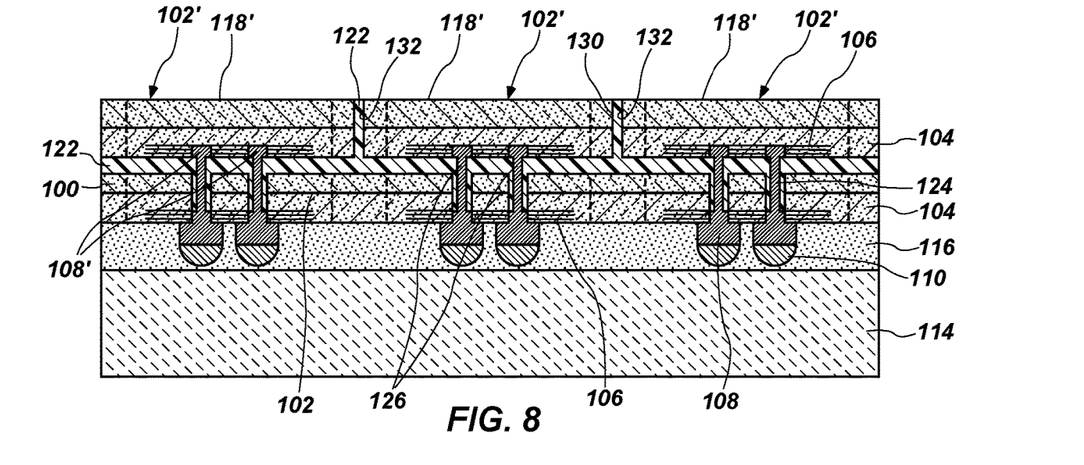

As shown in FIG. 8, a chip-on-wafer (COW) thinning process has been performed to remove excess dielectric material 122 over the back sides 118' of semiconductor dice 102', leaving dielectric material 122 in spaces 130 between adjacent semiconductor dice 102' and over exposed side surfaces 132 thereof.

Figure 9:
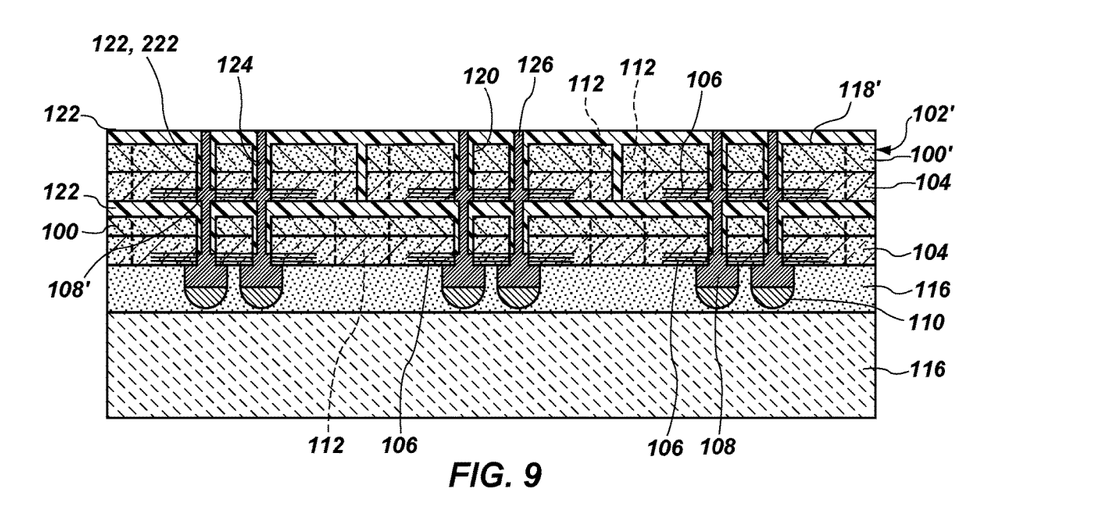

Subsequently, as shown in FIG. 9, yet another dielectric material 122 is disposed over the back sides 118' of semiconductor dice 102'. Through vias 120 extending to active circuitry 106 of each semiconductor dice 102' are then formed from the back sides 118' thereof through dielectric material 122 by a conventional technique. Through vias 120 are then lined with a dielectric material 222 and filled with a conductive material, for example, copper, to form conductors 124 comprising conductive pillars 126 protruding above back sides 118' of semiconductor dice 102' and to the surface of dielectric material 122.

In another embodiment, the first level of singulated semiconductor dice 102' being placed on semiconductor die locations 102 (FIG. 6) and further levels of singulated semiconductor dice 102' being stacked (FIG. 10) have each been previously thinned and further processed at the wafer level (FIG. 5A) by application of a dielectric material 122 to back side 118, then forming through vias 120 into wafer 100', through vias then being lined with dielectric material 222 and filled with a conductive material to form conductors 124 comprising conductive pillars 126 protruding above back sides 118 to the surface of dielectric material 122. Semiconductor dice 102', with dielectric material 122 and conductive pillars 126 in place, may then be singulated and stacked. Such an embodiment may facilitate more rapid fabrication of the stacks of semiconductor dice 102', increase yield and enable tighter control of bond line width.

Figure 10:
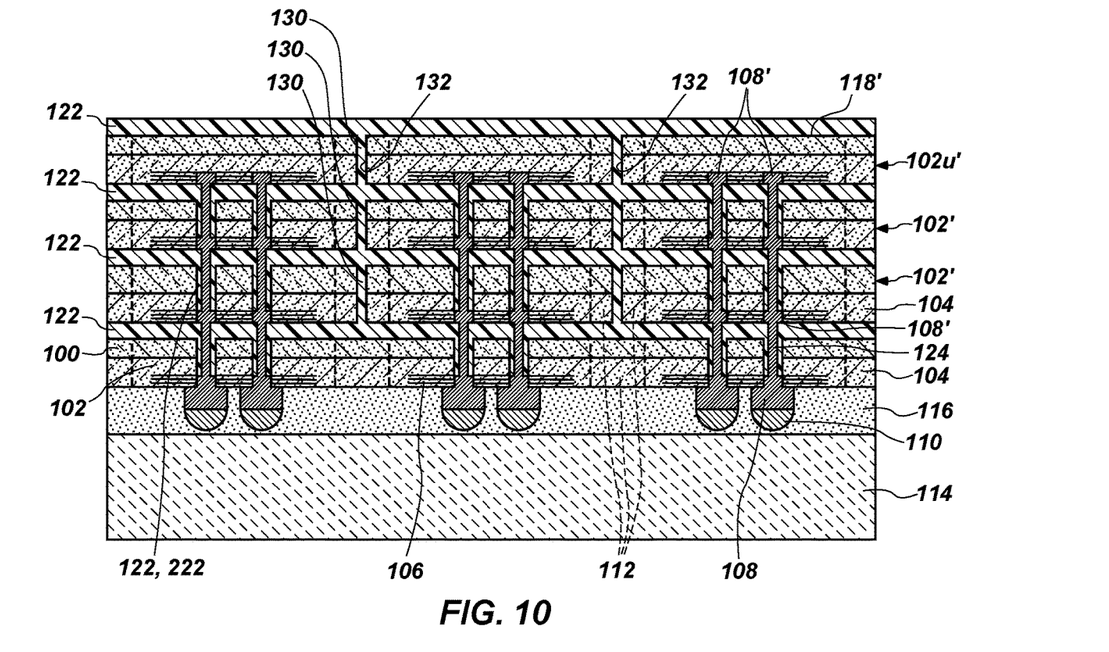

Additional levels of semiconductor dice 102' as shown in FIG. 10 are then stacked at each semiconductor die location 102 of wafer 100, each semiconductor die 102' secured and electrically connected to an underlying semiconductor die 102' as described above with respect to FIGS. 6 through 9 and configured with through vias 120 and conductive pillars 126 for connection to terminal pads 108' of another semiconductor die 102' until a desired number of layers of semiconductor dice 102' is formed. The uppermost semiconductor die 102u', however, does not require through vias. At that point, and as illustrated in FIG. 10, back sides 118' of uppermost semiconductor dice 102' are covered with dielectric material 122 extending into spaces 130 between adjacent semiconductor dice 102' and over exposed side surfaces 132 thereof.

Figure 11:
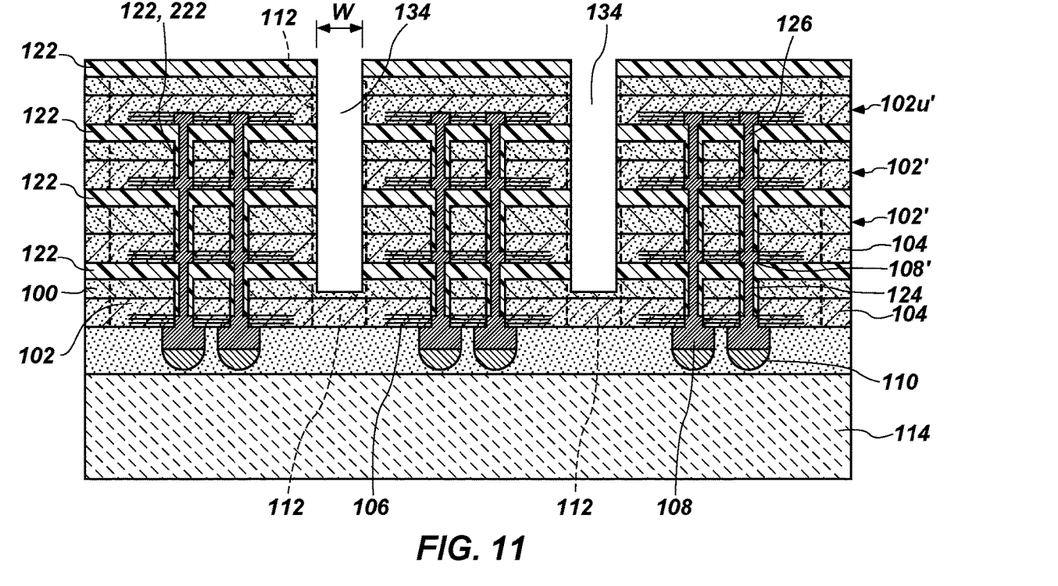

Referring now to FIG. 11, the assemblies of stacked semiconductor dice 102' on semiconductor die locations 102 of wafer 100 are partially singulated to a depth into wafer 100, for example, above device layer 104, singulation being effected in first cuts with a dicing saw of a width W sized to remove dielectric material 122 or 222 from between adjacent semiconductor dice 102' as well as material from substantially an entirety of each scribe area 112 of mutually adjacent semiconductor dice 102' in adjacent stacks of semiconductor dice 102' and form a larger space 134.

Figure 12:
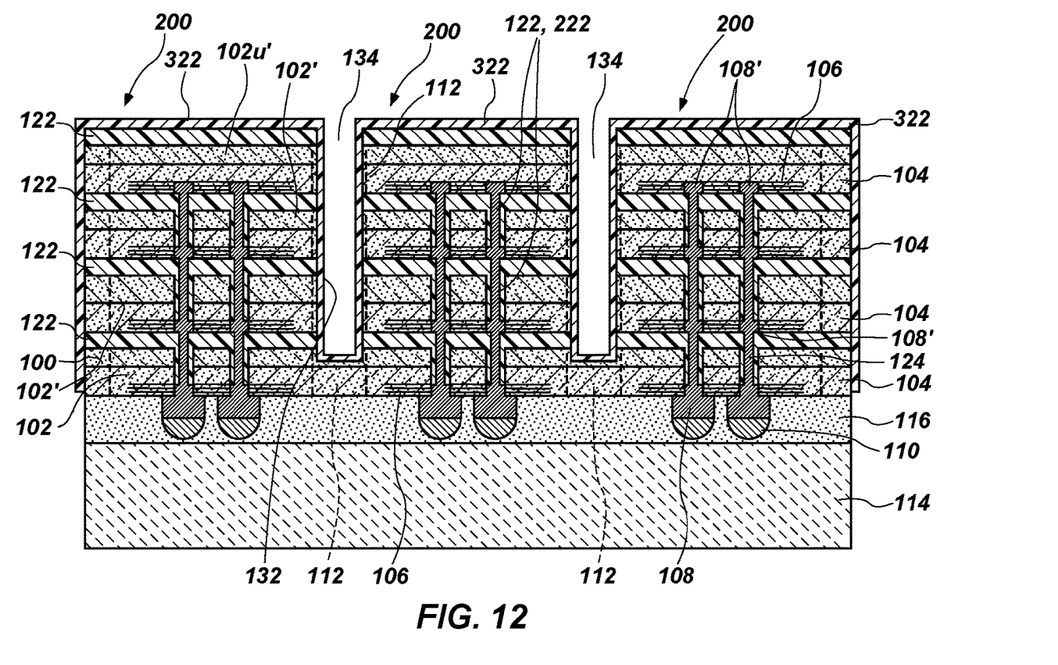
Figure 15:
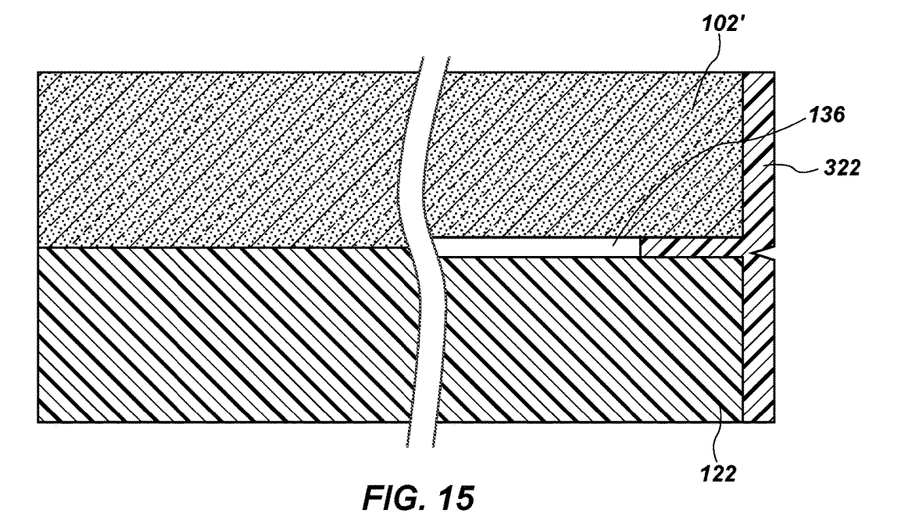
FIG. 15 is an enlarged schematic cross-sectional view of a portion of a semiconductor die of a package according to embodiments of the disclosure.

As shown in FIG. 12, another dielectric material 322 comprising an environmental coating deposited by, for example, one of the techniques referred to above is effected to prevent moisture penetration into each assembly 200 of multiple semiconductor dice 102' and a partially singulated semiconductor die location 102. Dielectric material 322 extends over back sides of the uppermost dice 102' of each assembly 200, over sides of the die stacks in contact with material of the semiconductor dice 102', and laterally outwardly over exposed surfaces of the partially singulated semiconductor die locations 102. Suitable dielectric materials may be non-polymeric and formed in situ over assemblies 200. Such dielectric materials include, for example, a silicon nitride or a silicon oxynitride, applied to form a substantially conformal coating of a thickness of between about 25 μm and about 50 μm. FIG. 15 illustrates the effect of such an applied dielectric material 322 to not only substantially conformally coat exterior surfaces of the die stacks, but also to fill any exposed peripheral spaces 136 between, for example, a semiconductor die 102' and an adjacent, previously applied dielectric material 122 in the bond line between mutually superimposed semiconductor dice 102'.

Figure 13:
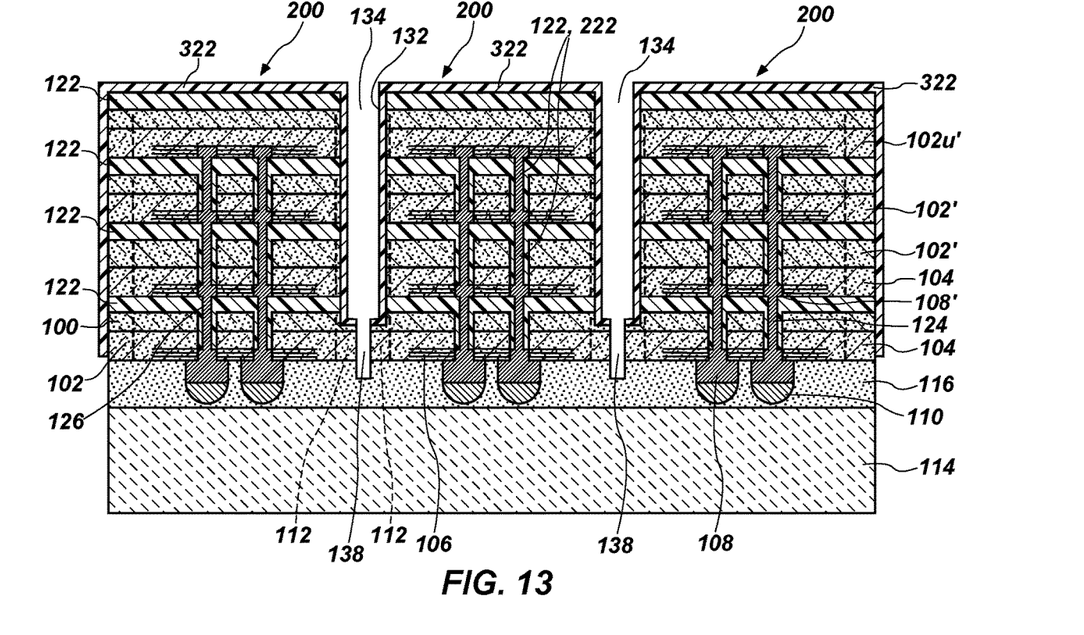
Figure 14:
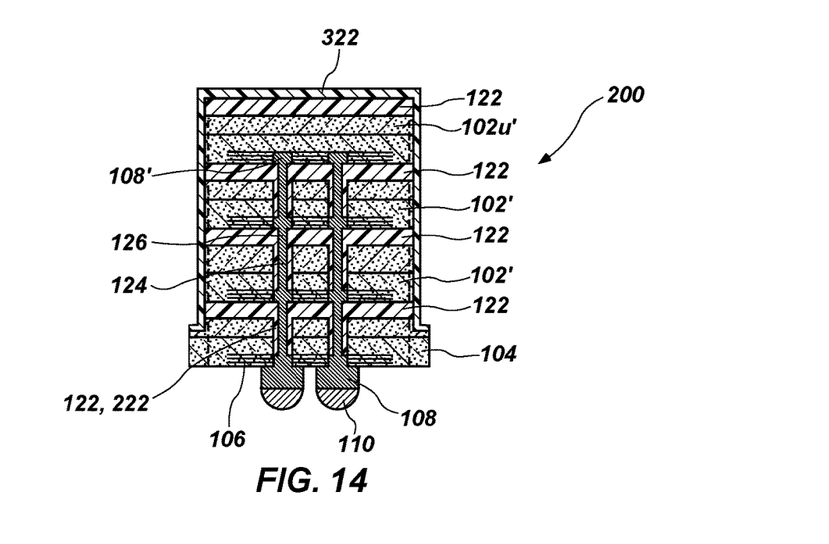

In FIG. 13, each assembly 200 is then singulated in second, narrower cuts through an entire depth of wafer 100 and into adhesive 116 through a center of each space 134 and using a dicing saw of a width substantially less than the width of spaces 134 to cut gaps 138, so as to not contact dielectric material 322 of protective coating on side surfaces 132 of semiconductor dice 102' and completely sever adjacent semiconductor die locations 102 of wafer 100 and singulate assemblies 200. Each singulated assembly 200 is then removed from carrier substrate 114 by conventional pick-and-place equipment after adherence of adhesive 116 to carrier substrate 114 is substantially compromised by application of an appropriate release agent depending on the nature of adhesive 116 (e.g., a thermal release adhesive, a solvent release adhesive, or an ultraviolet (UV) release adhesive). An individual assembly 200 after package completion is shown in FIG. 14.

Figure 16A:
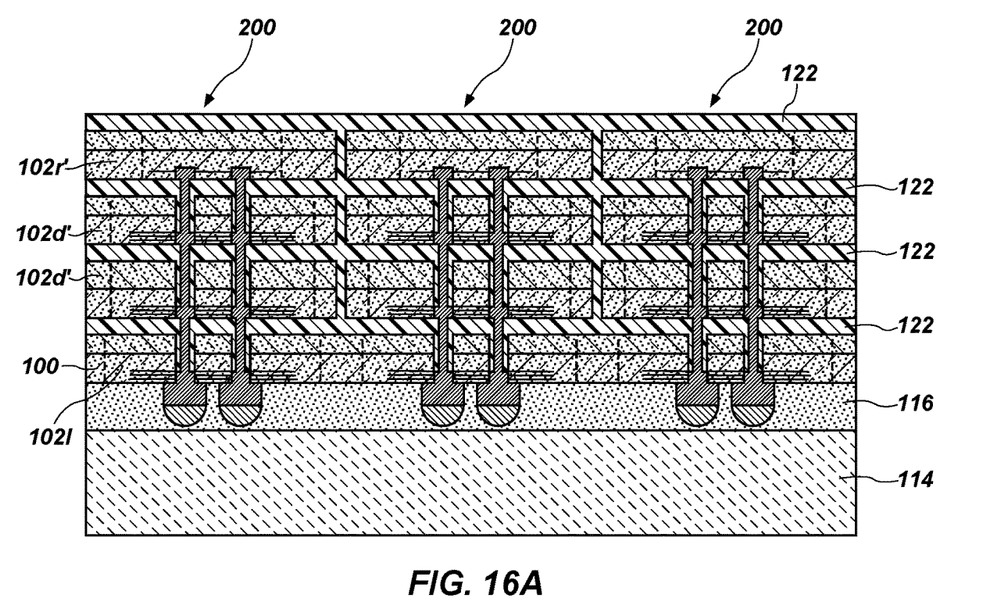
FIG. 16A is a schematic cross-sectional view of a semiconductor device package fabricated according to an embodiment of the disclosure and including memory dice and an RF die.

FIG. 16A depicts multiple in-process unsingulated assemblies 200 of heterogeneous semiconductor dice 102' stacked on semiconductor die locations 102 of a wafer 100 at a stage of fabrication corresponding to that depicted and described with respect to FIG. 10. In FIG. 16A, wafer 100 comprises logic die locations 102*l*, upon which DRAM dice 102*d*' are stacked, and over which at the top of each stack is an RF die 102*r*'.

Figure 16B:
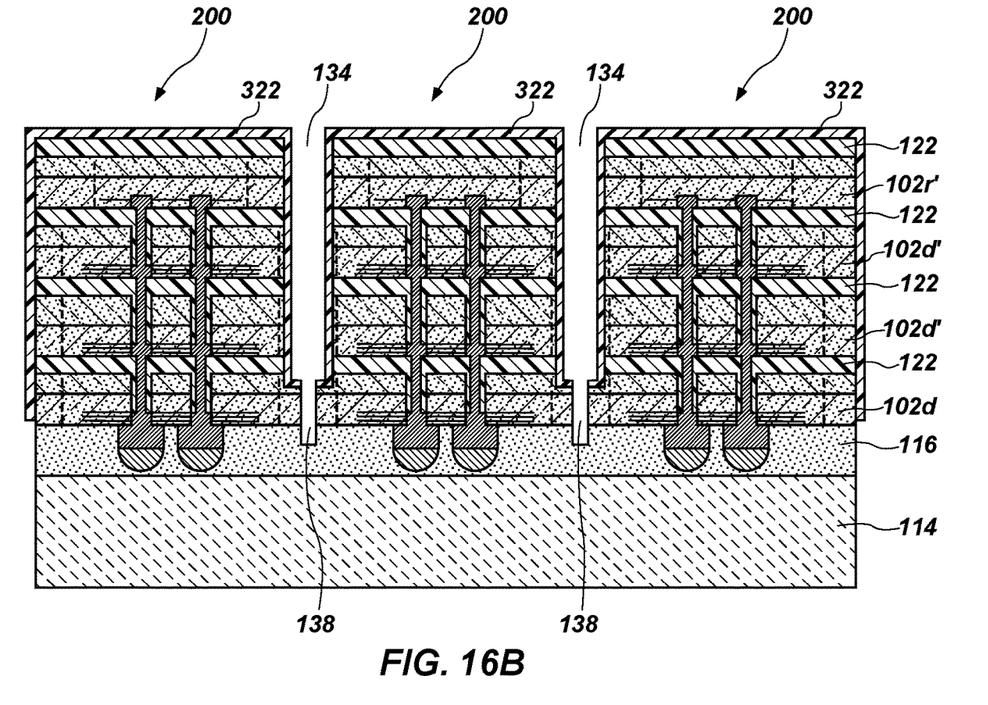
FIG. 16B is a schematic cross-sectional view of a semiconductor device package fabricated according to an embodiment of the disclosure and including memory dice and a logic die.

FIG. 16B depicts other, singulated assemblies 200 of semiconductor dice 102' stacked on severed semiconductor die locations 102 of a wafer 100 prior to removal from carrier substrate 114. In FIG. 16B, wafer 100 comprises DRAM die locations 102*d*, multiple DRAM dice 102*d*' are stacked on each DRAM die location 102*d*, and at the top of each stack is an RF die 102*r*'.

Notably, in each of FIGS. 16A and 16B, the relatively wide scribe area at a periphery of each die location 102 and each die 102' in a given stack provides wide tolerances for singulation and enables semiconductor dice exhibiting different functionalities to be stacked into an assembly of controlled die width, which may then be fabricated into a cube with mutually parallel, aligned die sides, facilitating environmental protection with a post-assembly applied coating of the types disclosed. A conventional requirement for encapsulation of the assemblies with a molding compound is also eliminated. In addition, loss of wafer material may be minimized by close spacing of adjacent die stacks, enabled by use of the disclosed dielectric materials, and heights of the die stacks may be substantially reduced by use of the disclosed dielectric materials in the bond line in lieu of conventional dielectrics such as non-conductive pastes, non-conductive films and capillary underfills. Finally, the noted elimination of a requirement for encapsulation of the assemblies with a conventional molding compound significantly reduces the footprint, and thus the real estate required by the package on higher-level packaging.

Figure 17:
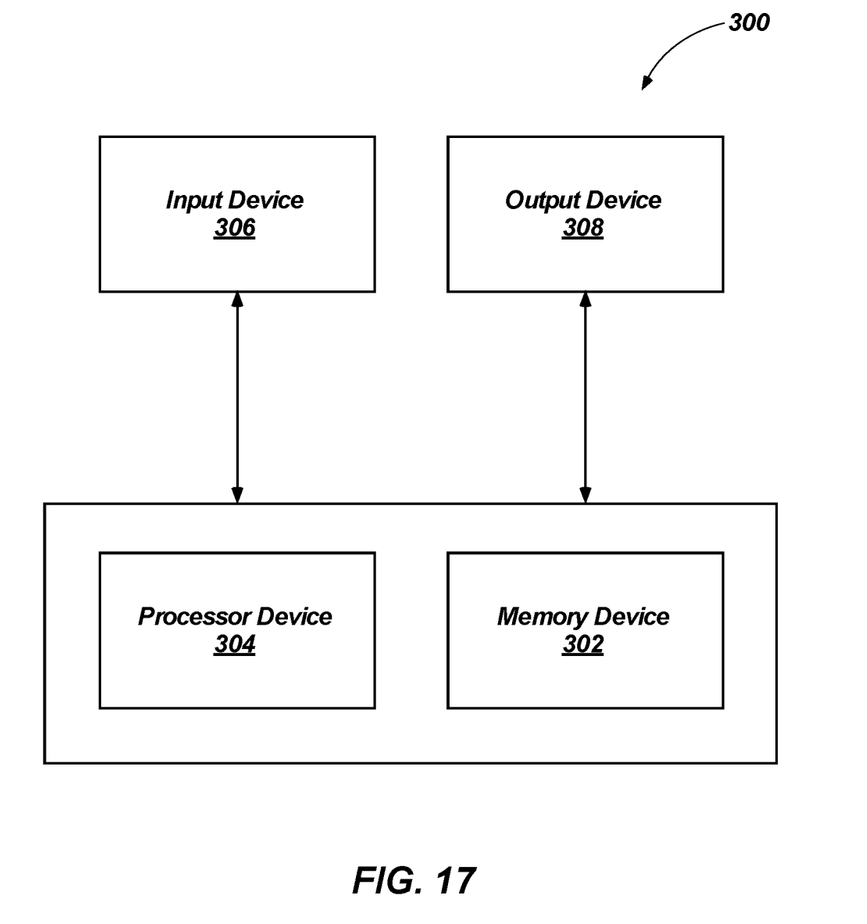
FIG. 17 is a block diagram of an electronic system including at least one semiconductor device package according to one or more embodiments of the disclosure.

Semiconductor devices (e.g., the packaged semiconductor device assemblies 200) in accordance with embodiments of the disclosure may be used in embodiments of electronic systems of the disclosure. For example, FIG. 17 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 300 includes at least one memory device 302. The memory device 302 may include, for example, an embodiment of a semiconductor device assembly 200 described herein. Such memory device may, optionally, include dice configured for other functions such as, for example, a logic die, an RF die, or both. The electronic system 300 may further include at least one electronic signal processor device 304 (often referred to as a "microprocessor"). The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304. It is also contemplated that, in lieu of separate memory and signal processor devices 302 and 304, a single assembly 200 may be configured as a system in a package including a processor and/or other die functionalities as noted previously.

In an embodiment, a method for fabricating a semiconductor device package comprises adhering a wafer comprising laterally spaced semiconductor die locations thereof to a carrier substrate with an active surface of the wafer facing the carrier substrate, forming a dielectric material over a back side of the wafer, placing a first level of singulated semiconductor dice in mutually laterally spaced relationship over respective semiconductor die locations and connecting conductive pillars protruding from the back side of the wafer through the dielectric material to aligned terminal pads of the semiconductor dice.

In another embodiment, a method of forming a semiconductor device package comprises stacking multiple levels of singulated semiconductor dice in mutually laterally spaced relationship over respective semiconductor die locations on a back side of a wafer, and before stacking each singulated semiconductor die, forming a dielectric bond line material over a back side of a semiconductor die location or a lower singulated semiconductor die. Terminal pads of singulated dice are connected to conductive pillars exposed through the dielectric bond line material over the back sides of the semiconductor die locations or over back sides of a lower level of singulated semiconductor dice, cuts of a first width are made into spaces between the singulated semiconductor dice, into material in scribe areas thereof and into material of the wafer within scribe areas between semiconductor die locations. A coating is formed over back sides of uppermost dice of the stacks, over sides of the singulated semiconductor dice and over material of the wafer between semiconductor die locations and cuts of a second, narrower width are made between the stacks into and through remaining material of the wafer between the semiconductor die locations.

In a further embodiment, a semiconductor device package comprises a stack of semiconductor dice, wherein a surface of a lowermost semiconductor die of the stack protrudes laterally beyond a periphery of other, higher semiconductor dice of the stack, a non-polymeric dielectric bond line material between adjacent semiconductor dice of the stack, connections between metal pillars and aligned terminal pads of adjacent semiconductor dice of the stack, the connections comprising diffusion bonds or mutual contact secured by dielectric bonding of the semiconductor dice with the dielectric bond line material and a substantially conformal, non-polymeric coating extending over a back side of an uppermost semiconductor die of the stack, over and in contact with material of the semiconductor dice on sides of the stack and over and in contact with the laterally protruding surface of the lowermost semiconductor die of the stack.

In yet another embodiment, an electronic system comprises at least one input device, at least one output device, a processor device operably coupled to the at least one input device and the at least one output device and a memory device. The memory device comprises a stack of semiconductor dice, wherein a lowermost semiconductor die of the stack protrudes laterally beyond a periphery of other, higher semiconductor dice of the stack, a dielectric bond line material comprising an in situ formed compound between adjacent semiconductor dice of the stack, and connections between metal pillars and aligned terminal pads of adjacent semiconductor dice of the stack, the connections comprising diffusion bonds or mutual contact secured by dielectric bonding of the semiconductor dice. A substantially conformal coating comprising an in situ formed compound extends over a back side of an uppermost semiconductor die of the stack, over and in contact with material of the semiconductor dice on sides of the stack and over and in contact with the laterally protruding lowermost semiconductor die of the stack.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A semiconductor device package, comprising:
a stack of semiconductor dice, wherein a surface of a lowermost semiconductor die of the stack protrudes laterally beyond a periphery of other, higher semiconductor dice of the stack;
a non-polymeric dielectric bond line material between adjacent semiconductor dice of the stack;
connections between metal pillars and aligned terminal pads of adjacent semiconductor dice of the stack, the connections comprising diffusion bonds or mutual contact secured by a dielectric bond with the non-polymeric dielectric bond line material; and
a substantially conformal, non-polymeric coating extending over a back side of an uppermost semiconductor die of the stack, over and in contact with a material of the respective semiconductor dice on sides of the stack and over and in contact with the laterally protruding surface of the lowermost semiconductor die of the stack.

2. The semiconductor device package of claim 1, further comprising conductive pillars protruding from a surface of the lowermost semiconductor die opposite other semiconductor dice of the stack.

3. The semiconductor device package of claim 1, wherein the substantially conformal, non-polymeric coating extends into openings between the non-polymeric dielectric bond line material and material of adjacent semiconductor dice of the stack at a lateral periphery thereof.

4. The semiconductor device package of claim 1, wherein the non-polymeric dielectric bond line material and the non-polymeric coating each comprise an in situ formed compound.

5. The semiconductor device package of claim 4, wherein the compounds are selected from a group consisting of a silicon oxide, a silicon nitride, a silicon oxynitride, a TEOS oxide or an $O_3$/TEOS oxide.

6. The semiconductor device package of claim 1, wherein at least one semiconductor die of the stack exhibits a functionality other than memory.

7. The semiconductor device package of claim 6, wherein the at least one other semiconductor die exhibits a functionality comprising logic, processor or radiofrequency.

8. A semiconductor device package, comprising:
a stack of semiconductor dice;
a non-polymeric dielectric bond line material between adjacent semiconductor dice of the stack;
electrical connections between semiconductor dice of the stack, the connections comprising diffusion bonds or mutual contact secured by a dielectric bond with the non-polymeric dielectric bond line material; and
a non-polymeric coating extending over a back side of an uppermost semiconductor die of the stack, over and in contact with a material of the respective semiconductor dice on sides of the stack.

9. The semiconductor device package of claim 8, further comprising conductive elements protruding from the lowermost semiconductor die opposite other semiconductor dice of the stack.

10. The semiconductor device package of claim 8, wherein the non-polymeric coating extends into openings between adjacent semiconductor dice of the stack at a lateral periphery thereof.

11. The semiconductor device package of claim 8, wherein the non-polymeric dielectric bond line material and the non-polymeric coating each comprise an in situ formed compound.

12. The semiconductor device package of claim 11, wherein each compound is a silicon oxide, a silicon nitride, a silicon oxynitride, a tetraethyl orthosilicate (TEOS) oxide or an ozone ($O_3$)/TEOS oxide.

13. The semiconductor device package of claim 12, wherein a compound of the bond line material is different than a compound of the coating.

14. The semiconductor device package of claim 8, wherein one or more semiconductor dice of the stack exhibits a functionality other than memory.

15. The semiconductor device package of claim 14, wherein each compound is a silicon oxide, a silicon nitride, a silicon oxynitride, a tetraethyl orthosilicate (TEOS) oxide or an ozone ($O_3$)/TEOS oxide.

16. The semiconductor device package of claim 15, wherein a compound of the non-polymeric dielectric bond line material is different than a compound of the non-polymeric coating.

17. The semiconductor device package of claim 8, wherein active surfaces of all semiconductor dice of the stack face in a common direction.

* * * * *

UNITED STATES PATENT AND TRADEMARK OFFICE
CERTIFICATE OF CORRECTION

PATENT NO. : 10,797,018 B2  
APPLICATION NO. : 16/392221  
DATED : October 6, 2020  
INVENTOR(S) : Eiichi Nakano Page 1 of 1

It is certified that error appears in the above-identified patent and that said Letters Patent is hereby corrected as shown below:

In the Specification

| | | | |
|---|---|---|---|
| | Column 1, | Line 9, | change "2018, pending," to --2018, now U.S. Patent No. 10,319,696, issued Jun. 11, 2019,-- |

In the Claims

| | | | |
|---|---|---|---|
| Claim 1, | Column 9, | Line 54-55, | change "coating extending over" to --coating extending entirely over-- |
| Claim 8, | Column 10, | Line 27, | change "coating extending over" to --coating extending entirely over-- |

Signed and Sealed this  
Fifth Day of January, 2021

Andrei Iancu  
*Director of the United States Patent and Trademark Office*